United States Patent
Kuekes et al.

(10) Patent No.: US 7,447,055 B2
(45) Date of Patent: Nov. 4, 2008

(54) MULTIPLEXER INTERFACE TO A NANOSCALE-CROSSBAR

(75) Inventors: Philip J. Kuekes, Menlo Park, CA (US); R. Stanley Williams, Portola Valley, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 339 days.

(21) Appl. No.: 11/112,085

(22) Filed: Apr. 22, 2005

(65) Prior Publication Data
US 2006/0238223 A1    Oct. 26, 2006

(51) Int. Cl.
*G11C 11/00*    (2006.01)
(52) U.S. Cl. .................. 365/148; 365/151; 365/175; 977/938
(58) Field of Classification Search .......... 365/148, 365/151, 175; 977/938
See application file for complete search history.

(56) References Cited

U.S. PATENT DOCUMENTS

| | | | |
|---|---|---|---|
| 6,128,214 A | 10/2000 | Kuekes et al. | |
| 6,256,767 B1 | 7/2001 | Kuekes et al. | |
| 6,880,146 B2 * | 4/2005 | Snider | 716/17 |
| 7,211,503 B2 * | 5/2007 | Chen et al. | 438/597 |
| 2006/0202358 A1 * | 9/2006 | Snider | 257/786 |

OTHER PUBLICATIONS

Chen, Yong et al., "Nanscale molecular-switch crossbar circuits", Institute of Physics Publishing, Nanotechnology 14 (2003) 462-468, 2003 IOP Publishing Ltd., Printed in UK.

Stewart, Duncan—"Molecular Electronics"—Internet article 2004—85 pages.

Snider, G. S. et al.—"Crossbar Demultiplexers for Nanoelectronics Based on N-Hot Codes"—IEEE Transactions on Nanotechnology—vol. 4 No. 2—Mar. 2005—pp. 249-254.

* cited by examiner

*Primary Examiner*—Hoai V Ho

(57) ABSTRACT

Various embodiments of the present invention are directed to electronic means for reading the content of a nanowire-crossbar memory. In one embodiment of the present invention, a microscale or sub-microscale signal line is interconnected with one set of parallel nanowires emanating from a nanowire-crossbar memory by configurable, nanowire-junction switches. The microscale or sub-microscale signal line serves as a single-wire multiplexer, allowing the contents of any particular single-bit storage element within the nanowire-crossbar memory to be read in a three-cycle READ operation.

17 Claims, 11 Drawing Sheets

MULTIPLEXER INTERFACE TO A NANOSCALE-CROSSBAR

STATEMENT OF GOVERNMENT INTEREST

This invention has been made with Government support under Agreement #MDA972-01-3-005, awarded by DARPA Moletronics. The government has certain rights in the invention.

TECHNICAL FIELD

The present invention relates to electronic devices and circuits, and, in particular, to a multiplexer for reading information stored in a nanowire-crossbar memory, and for interfacing a nanowire crossbar to sub-microscale and/or microscale electronics.

BACKGROUND OF THE INVENTION

Recently, as the design and manufacture of electronic devices and circuits by conventional, photolithography-based methods has begun to approach physical limits to further decreases in component sizes, alternative methods for manufacturing nanoscale electronic circuits have been developed. Nanowire-crossbar technology is a particularly promising new approach to fabrication of electronic circuits and devices with dimensions significantly less than, and component densities correspondingly greater than, the submicroscale circuits and components that can be currently produced by photolithographic methods.

FIG. 1 illustrates an exemplary nanowire crossbar. The nanowire crossbar in FIG. 1 implements a simple memory device. The nanowire crossbar comprises: (1) a first set of parallel nanowires 102; (2) a bistable bit-storage layer 104; and (3) a second layer of parallel nanowires 106 perpendicular to the first layer of parallel nanowires 102. A single bit of information is stored within each small region of the bit-storage layer 104 at each point of minimal separation, or intersection, between a nanowire of the first layer of nanowires 102 and a nanowire of the second layer of nanowires 106. For example, the small region 108 of the bit-storage layer 104, shown crosshatched in FIG. 1, that overlies nanowire 110 and underlies nanowire 112, forms, along with the portions of nanowires 110 and 112 in contact with the small region, a nanowire junction that serves as a single-bit storage element 114 within the nanoscale memory.

In many nanoscale-memory embodiments, the contents of a single-bit storage element, such as single-bit storage element 114 in FIG. 1, are modified by applying voltage or current signals to one or both of the nanowires that intersect to form the single-bit storage element in order to change a physical state of the bistable bit-storage layer within the nanowire junction, such as the resistivity. In FIG. 1, for example, signals may be applied to one or both of nanowires 110 and 112 to modify single-bit storage element 114, as indicated in FIG. 1 by arrows, such as arrow 116. Generally, no signal, or a different signal, is applied to the remaining nanowires to distinguish the addressed single-bit storage element from all other single-bit storage elements. In many embodiments, signals of relatively large magnitude are applied to carry out WRITE operations, in which a physical state is changed, while relatively smaller magnitude signals are applied to carry out READ operations, in which the physical state is generally not changed, but instead merely determined. In READ operations, a physical state of a single-bit storage element is determined, from the presence, absence, or strength of a signal on one or both of the two nanowires that intersect to form the single-bit storage element, by applying one or more signals to nanowires of the nanowire crossbar. Nanoscale memories implemented by nanowire crossbars can be thought of as two-dimensional arrays of single-bit storage elements, each single-bit storage element separately and uniquely addressable through the two nanowires that intersect to form the single-bit storage element. In certain cases, entire rows, columns, or larger groups of single-bit storage elements within a two-dimensional nanoscale memory can be accessed in a single operation.

FIG. 1 provides a simple, schematic illustration of an exemplary nanowire crossbar. Although individual nanowires in FIG. 1 are shown with rectangular cross sections, nanowires can also have circular, ellipsoid, or more complex cross sections, and nanowires may have many different widths or diameters and aspect ratios or eccentricities. Nanowires can be fabricated using imprint lithography, by chemical self-assembly on surfaces and transfer to substrates, by chemical synthesis in place, and by a variety of other techniques from metallic and/or semiconducting elements or compounds, doped organic polymers, composite materials, nanotubes and doped nanotubes, and from many additional types of conductive and semiconducting materials. The bistable bit-storage layer 104 is shown in FIG. 1 as a continuous layer between two sets of parallel nanowires, but may alternatively be discontinuous, or may constitute sheath-like molecular coatings around, or component atoms or molecules within, the nanowires, rather than a separate layer. The bistable bit-storage layer 104 may also be composed of a wide variety of different metallic, semiconducting, doped polymeric, and composite materials.

Significant problems may be encountered with respect to interconnection of individual nanowire leads of a nanowire crossbar to submicroscale and microscale signal lines in order to incorporate the nanowire crossbar into conventional electronic devices, including identifying and manipulating individual nanowires. One solution to these problems is to employ demultiplexers with microscale or submicroscale address lines that are integrated with nanowire crossbars. FIG. 2 shows a nanowire-crossbar memory integrated with nanoscale/microscale demultiplexers to allow individual bit-storage elements of the nanowire-crossbar memory to be uniquely accessed via microscale or submicroscale address lines. In FIG. 2, a 16×16 nanowire crossbar 202 has parallel-nanowire layers in which nanowires are extended past the boundaries of the nanowire-crossbar array 202 to form a first demultiplexer 204 and a second demultiplexer 206. Demultiplexer 204 comprises the extended nanowires from a first parallel-nanowire layer of the nanowire crossbar, such as nanowire 208, overlain or underlain by a perpendicular, microscale or submicroscale source-voltage line 210 and four pairs 212-215 of perpendicular microscale or sub-microscale address lines. The second demultiplexer 206 is similarly implemented from the extended nanowires of the second parallel-nanowire layer of the nanowire crossbar. In certain types of implementations, such as the implementation shown in FIG. 2, address lines occur as complementary pairs, each pair representing one bit, and its inverse, of a multi-bit address, while in other implementations, single address lines may be used. Four-bit address input through the four pairs of address lines 212-215 are sufficient to provide a unique address for each of the 16 nanowires, such as nanowire 208, and two four-bit addresses input simultaneously to the four pairs of address lines of each of the two demultiplexers 204 and 206 can uniquely address a particular nanowire junction from among the 256 nanowire junctions within the nanoscale-crossbar array 202.

By placing a WRITE signal on the nanowires of a nanowire-crossbar memory that intersect at a particular single-bit storage element, the state of the single-bit storage element can be set to a desired one of the two bistable states that encode binary digit values "0" and "1." However, determining the state at a given single-bit storage element by applying a READ signal may be significantly more difficult. Designers, manufacturers, vendors, and integrators of nanowire-crossbar memories, as well as, ultimately, users of such devices have recognized the need for a reliable and efficiently manufactured means for reading the states of single-bit storage elements within a nanowire-crossbar memory, and designers, manufacturers, vendors, integrators, and users of other types of nanowire-crossbar-implemented devices have recognized the need for a reliable and efficiently manufactured interface for interconnecting the nanowire-crossbar-implemented devices with sub-microscale and microscale electronics.

SUMMARY OF THE INVENTION

Various embodiments of the present invention are directed to electronic means for reading the content of a nanowire-crossbar memory. In one embodiment of the present invention, a microscale or submicroscale signal line is interconnected with one set of parallel nanowires emanating from a nanowire-crossbar memory by configurable, nanowire-junction switches. The microscale or submicroscale signal line serves as a single-wire multiplexer, allowing the contents of any particular single-bit storage element within the nanowire-crossbar memory to be read in a three-cycle READ operation.

DETAILED DESCRIPTION OF THE INVENTION

Figure 1:
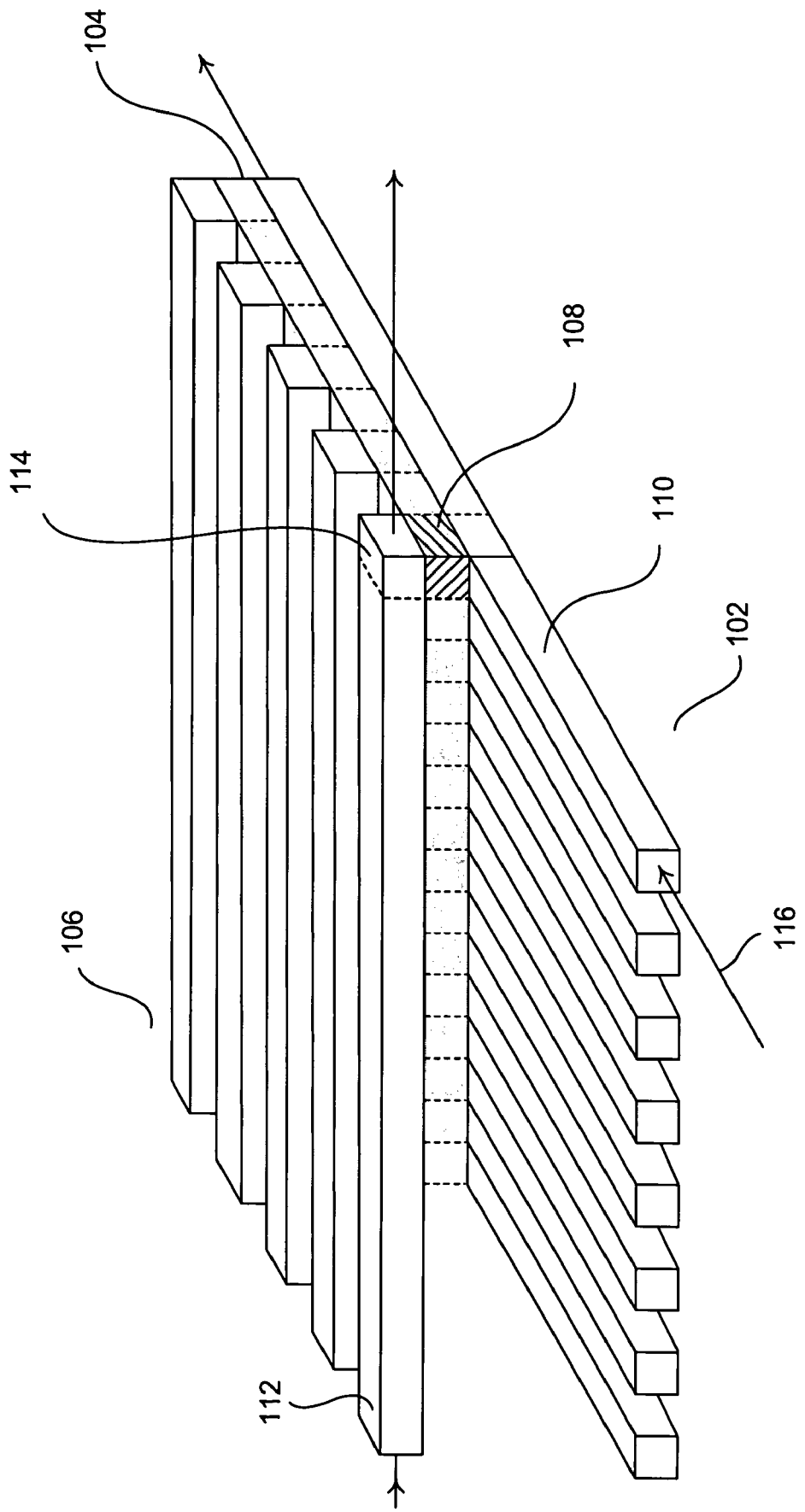
FIG. 1 illustrates an exemplary nanowire crossbar.
Figure 2:
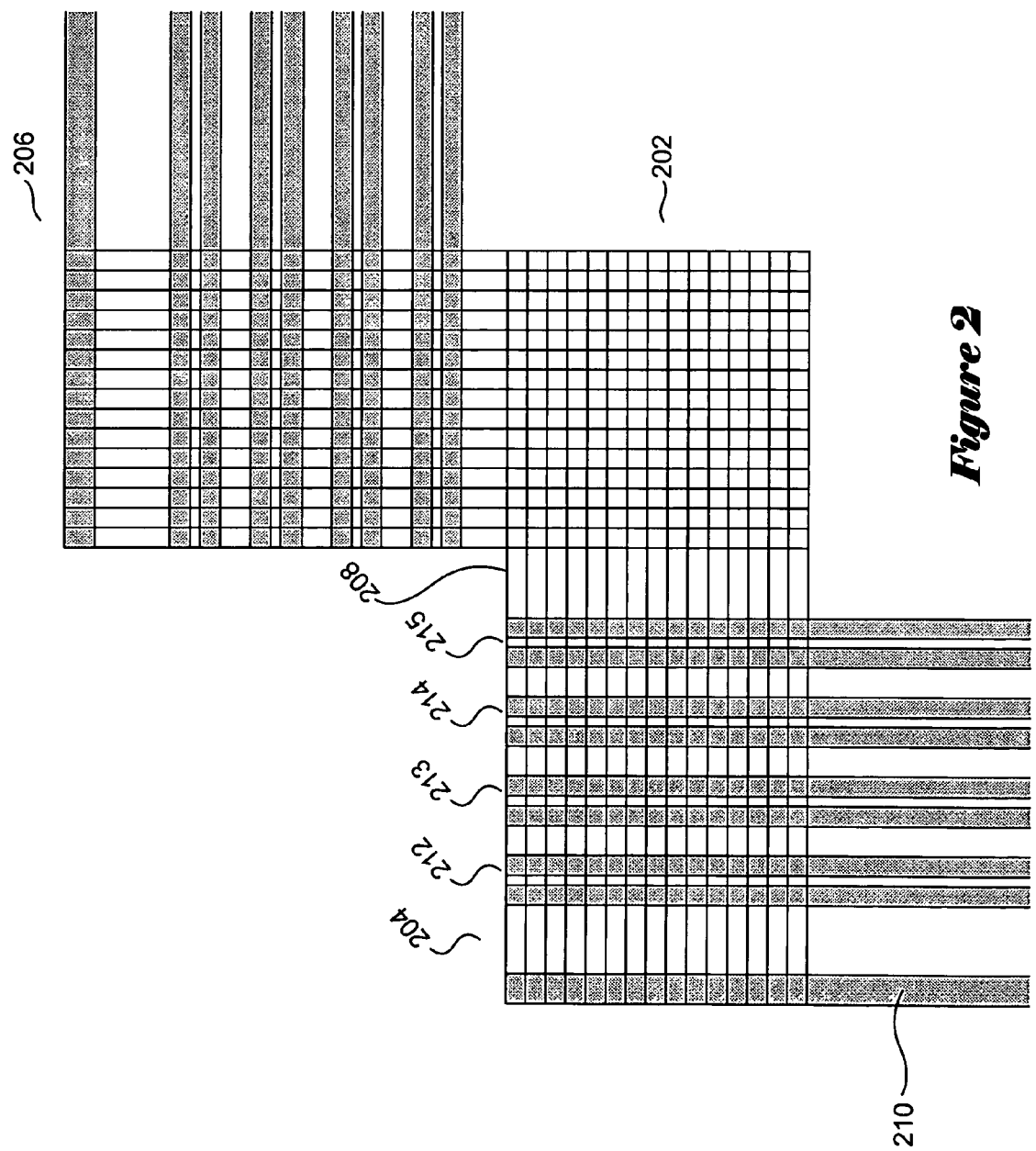
FIG. 2 shows a nanowire-crossbar memory integrated with nanoscale/microscale demultiplexers to allow individual bit-storage elements of the nanowire-crossbar memory to be uniquely accessed via microscale or submicroscale address lines.
Figure 3A:
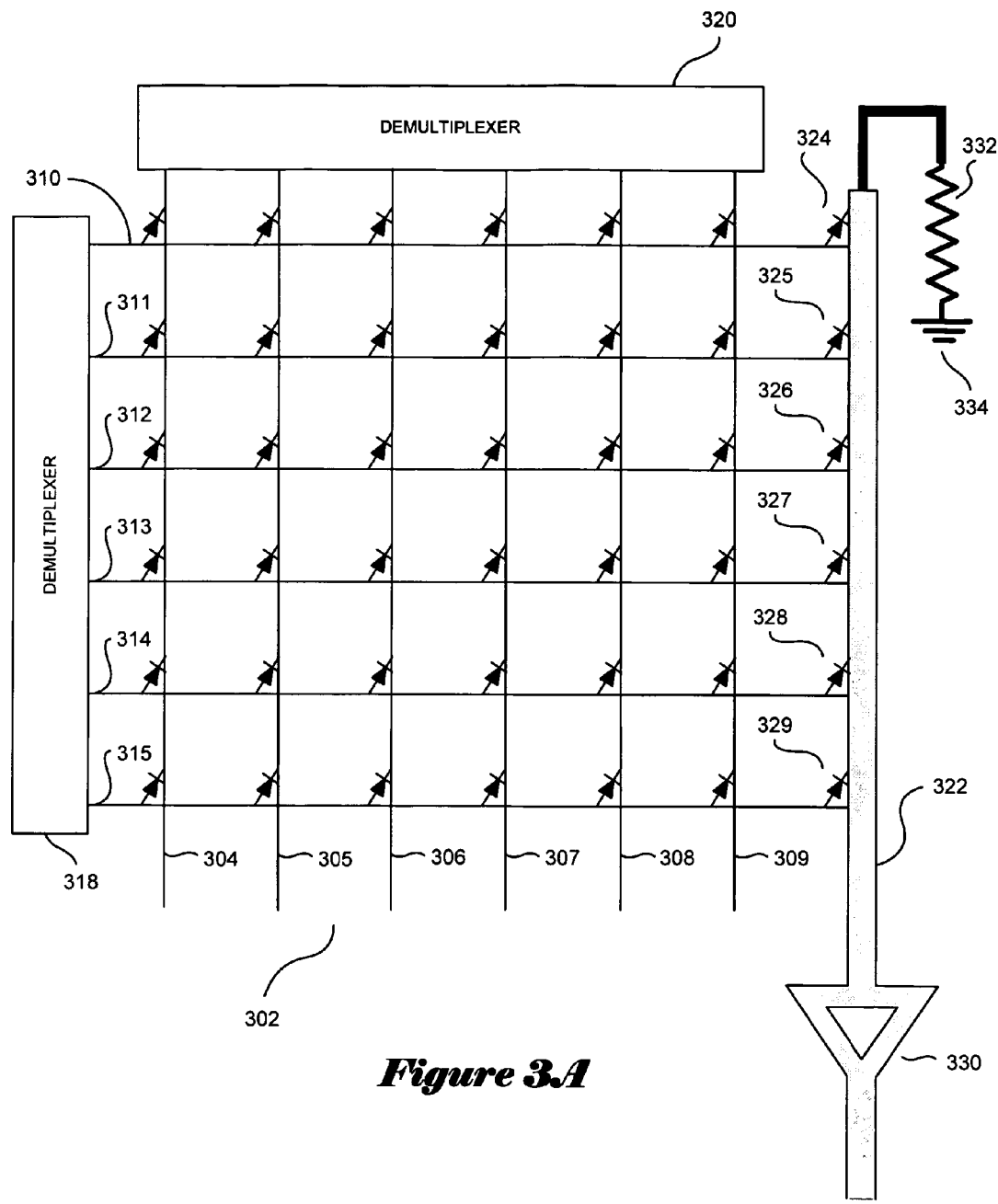
FIGS. 3A-D illustrate a first electronic multiplexer means, a READ operation employing the electronic multiplexer means, and deficiencies and disadvantages of the electronic multiplexer means.

Various embodiments of the present invention include electronic multiplexers for reading the contents of a selected single-bit storage element within a nanowire-crossbar memory. In the current discussion, the term "nanowire" refers to signal lines with widths less than those of sub-microscale signal lines that can be currently fabricated with conventional photolithographic techniques, less than 50 nanometers, less than 20 nanometers, or less than 10 nanometers. The term nanowire junction refers to an interconnection between a nanowire and another component, whether a second nanowire or a signal line or other component of larger scale. FIGS. 3A-D illustrate a first electronic multiplexer means, a READ operation employing the electronic multiplexer means, and deficiencies and disadvantages of the electronic multiplexer means. FIG. 3A employs illustration conventions used in all of FIGS. 3A-D. In FIG. 3A, a 6×6 nanowire-crossbar memory 302 stores single bits of information at each of 36 single-bit storage elements fabricated at nanowire junctions that interconnect nanowires of a first set of vertical, parallel nanowires 304-309 and nanowires of a second set of horizontal, parallel nanowires 310-315. Each nanowire junction is represented, in FIGS. 3A-D, as a diode, such as diode 316, directionally interconnecting a horizontal nanowire to a vertical nanowire. In the case of nanowire junction 316, horizontal nanowire 311 and vertical nanowire 305 are interconnected, with current or voltage signals generally transmissible through nanowire junction 316 from horizontal nanowire 311 to vertical nanowire 305, but not, under normal operating conditions, in the reverse direction. The bistable memory layer of the nanowire crossbar includes a semiconductive sub-layer, film, or another chemical or physical means that allows signals to pass in a forward direction, indicated by the direction of the arrow in the diode symbol, but resists passage of signals in the opposite direction. Diode nanowire junctions are preferable in nanowire-crossbar-memory applications because they eliminate unwanted circuits in the nanowire-crossbar memory, as discussed below.

A first demultiplexer 318 controls input of voltage or current signals to the horizontal set of nanowires 310-315, and a second demultiplexer 320 controls input of signals to the vertical set of nanowires 304-309. Thus, a particular single-bit storage element, such as single-bit storage element 316, can be written by applying a first WRITE signal to nanowire 311 by demultiplexer 318, and a corresponding, second WRITE signal to nanowire 305 by demultiplexer 320. In certain embodiments of a nanowire-crossbar memory, the first WRITE signal may be a relatively large magnitude, positive voltage signal, while the second WRITE signal may be a relatively large magnitude, negative voltage signal. Application of the first and second WRITE signals results in a substantial voltage drop across the single-bit storage element, placing the single-bit storage element in one of two stable physical states. The single-bit storage element can be placed in the other of two stable physical states by applying the second WRITE signal to horizontal nanowire 311 and the first WRITE signal to vertical nanowire 305, or, in other words, by reversing the signs of the voltage signals applied to the nanowires.

The contents of a selected single-bit storage element within the nanowire-crossbar memory shown in FIG. 3A are read using a single-wire multiplexer 322 interconnected with the horizontal set of nanowires 310-315 by diode-like nanowire junctions 324-329. The single-wire multiplexer 322 may be connected with an amplifier 330 in order to amplify a signal produced by a READ operation, and is also interconnected through a resistor 332 to ground 334. The resistance of the resistor 332 needs to be carefully chosen to be sufficiently high to direct signals, input from the horizontal nanowires 310-315 to the single-wire multiplexer 322, to the amplifier 330, but sufficiently low to pull the single-wire multiplexer 322 to a low-voltage or low-current state in the absence of an input signal. Furthermore, the resistance may need to be variable in order to prevent undesired state changes, or damage, to the diode-like nanowire junctions 324-329 interconnecting the horizontal nanowires 310-315 with the single-wire multiplexer 322.

Figure 3B:
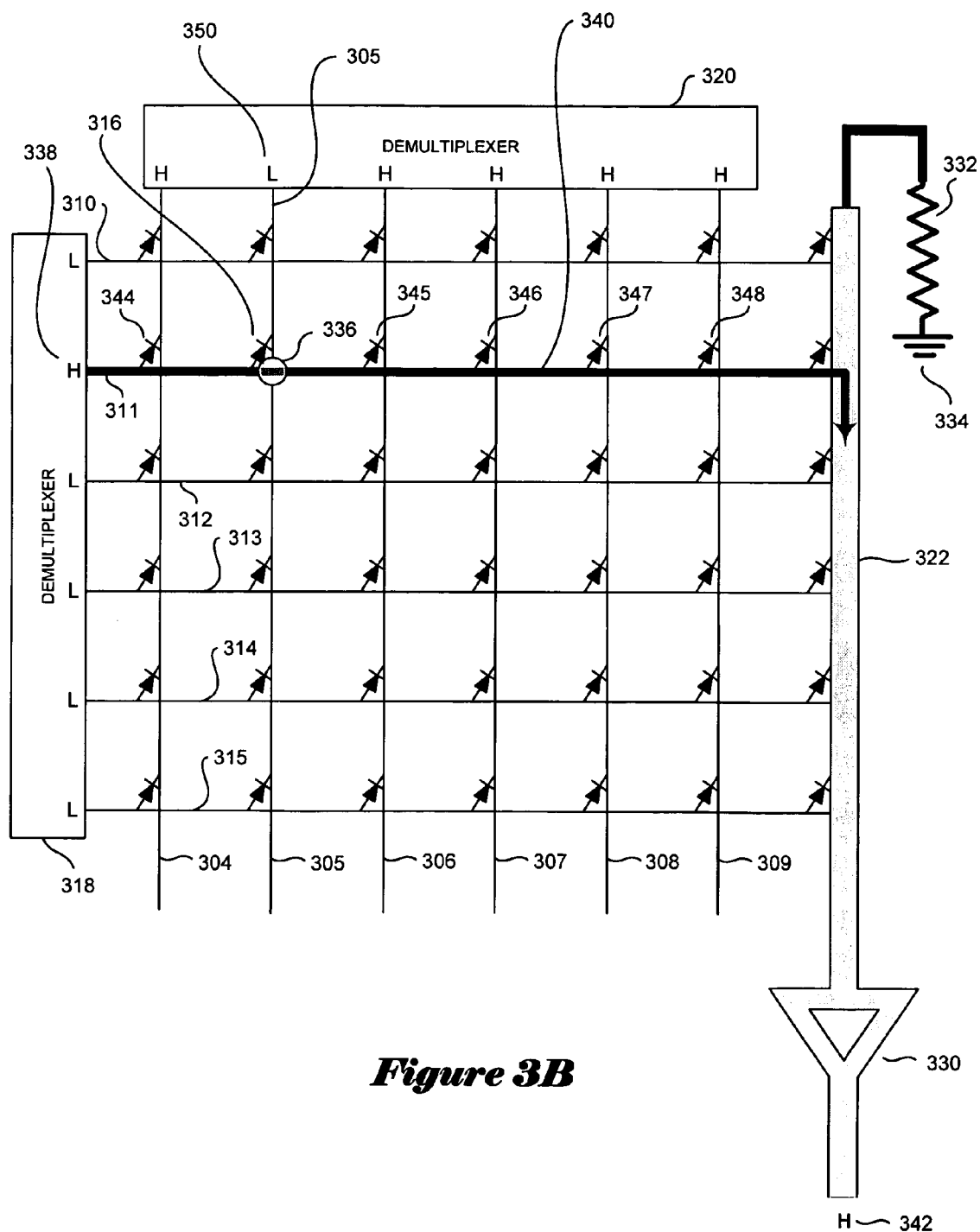

FIG. 3B illustrates detection of an open state in single-bit storage element, or nanowire junction, 316, corresponding to a high resistivity state of the nanowire junction, via a READ operation facilitated by the single-wire multiplexer.

When the single-bit storage element 316 is in an open state, as indicated by the unfilled circle 336 at the intersection between horizontal nanowire 311 and vertical nanowire 305, a relative weak voltage or current signal applied to nanowire 311 by the first demultiplexer 318, indicated in FIG. 3B by the symbol "H" 338 and by the thickened, dark line 340 superimposed over the line corresponding to nanowire 311, the input signal passes all the way to the single-wire multiplexer 322, results in detection of the signal by the single-wire multiplexer, as indicated by the symbol "H" 342 on the signal line output from the amplifier 330. The relatively weak voltage current signal applied to horizontal nanowire 311 passes nanowire junctions 344-348, because the diode-like nanowire junctions are not forward biased, as a result of input of matching, relatively weak voltage or current signals to vertical nanowires 304 and 306-309 by the second multiplexer 320. Although the second demultiplexer applies a low voltage to vertical nanowire 305, as indicated in FIG. 3B by the symbol "L" 350, the weak voltage or current signal applied by the first demultiplexer 318 to horizontal nanowire 311 cannot pass through nanowire junction 316 to vertical nanowire 305, held in a low state by demultiplexer 320, due to the high resistance of nanowire junction 316 in the open state. Because the first demultiplexer 318 holds horizontal nanowires 310 and 312-315 in a low voltage state, all of the remaining nanowire junctions interconnecting vertical nanowires 304 and 306-309 with horizontal nanowires 310 and 312-315 are not forward biased, and therefore current or voltage cannot leak through these nanowires to horizontal nanowires 310 and 312 315. Therefore, only the relatively weak voltage or current signal applied by the first demultiplexer 318 to horizontal nanowire 311 reaches single-wire multiplexer 322. Note also that the resistance of resistor 332 is sufficiently high that the signal applied by the first demultiplexer 318 to horizontal nanowire 311 is mostly directed to amplifier 330, rather than dissipated to ground 334.

Figure 3C:
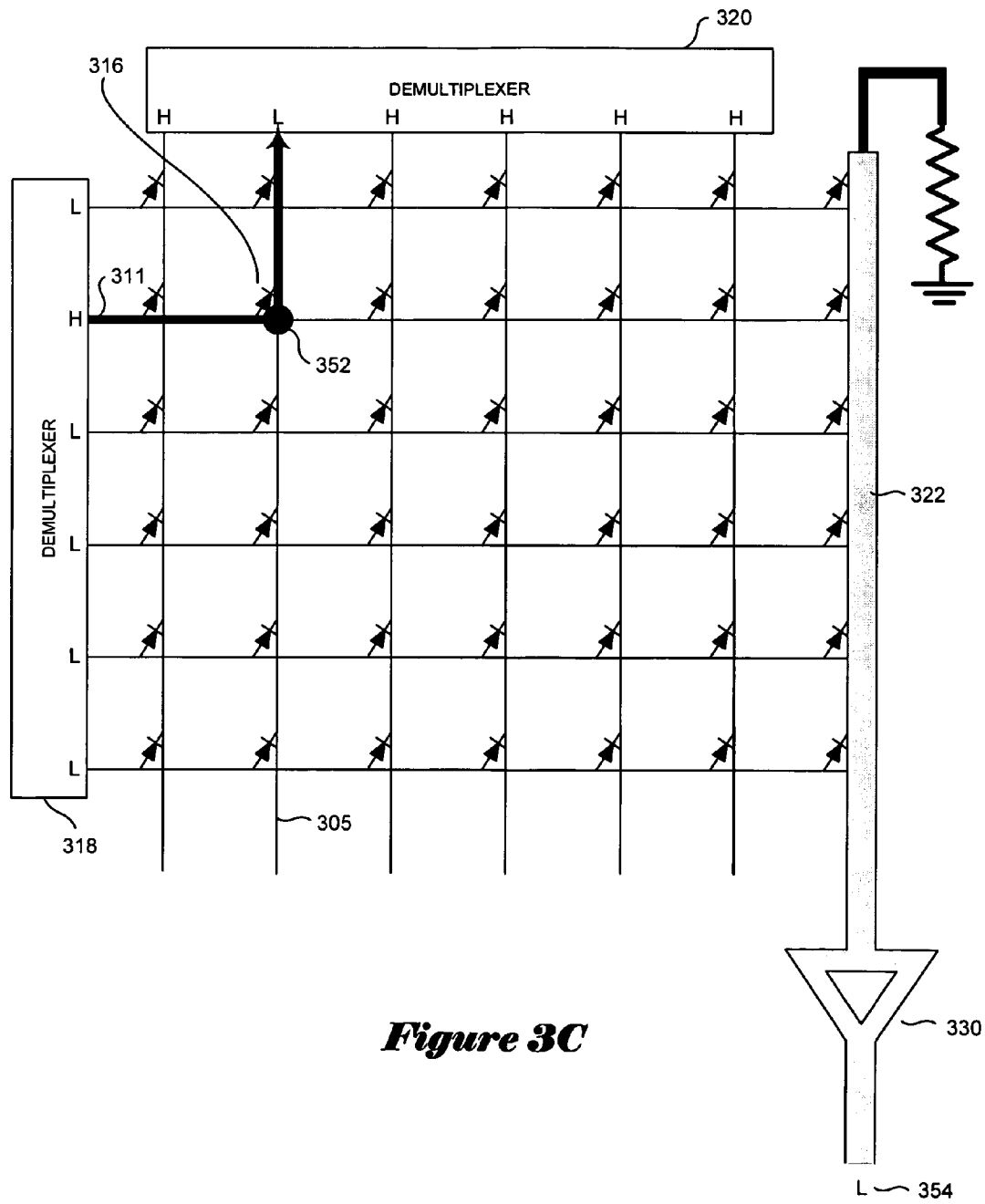

When the single-bit storage element 316 is in a low-resistivity state, or closed, as shown in FIG. 3C by a filled circle 352 at the intersection between horizontal nanowire 311 and vertical nanowire 305, the relatively weak current or voltage signal applied by the first demultiplexer 318 to horizontal nanowire 311 passes through nanowire junction 316 to vertical nanowire 305, held in a low-voltage or low-current state by the second demultiplexer 320, rather than passing to the single-wire multiplexer 322. Therefore, a low signal 354 is output by the amplifier 330 interconnected with the single-wire multiplexer 322.

Unfortunately, there may be problems associated with the single-wire multiplexer implementation discussed above with reference to FIGS. 3A-C. These problems are primarily related to the diode-like nanowire junctions 324-329 interconnecting the horizontal nanowires 310-315 with the single-wire multiplexer 322.

A first problem associated with the single-wire multiplexer implementation, discussed above, is that it may be technically or economically impractical to fabricate diode-like nanowire junctions between the horizontal nanowires and the single-wire multiplexer. The single-wire multiplexer may be manufactured in a separate step, partially or fully external to the nanowire-crossbar memory. Dependable fabrication of diode-like nanowire junctions between nanowires and a microscale or submicroscale single-wire multiplexer may not be technically feasible, in certain cases, or may introduce sufficient additional manufacturing costs to make the single-wire-multiplexer implementation too expensive for volume manufacturing. In certain cases, it may even be impractical or impossible to fabricate reliable diode-like nanowire junctions anywhere within a nanowire-crossbar memory, let alone at intersections between nanowires and a microscale or submicroscale single-wire multiplexer.

Figure 3D:
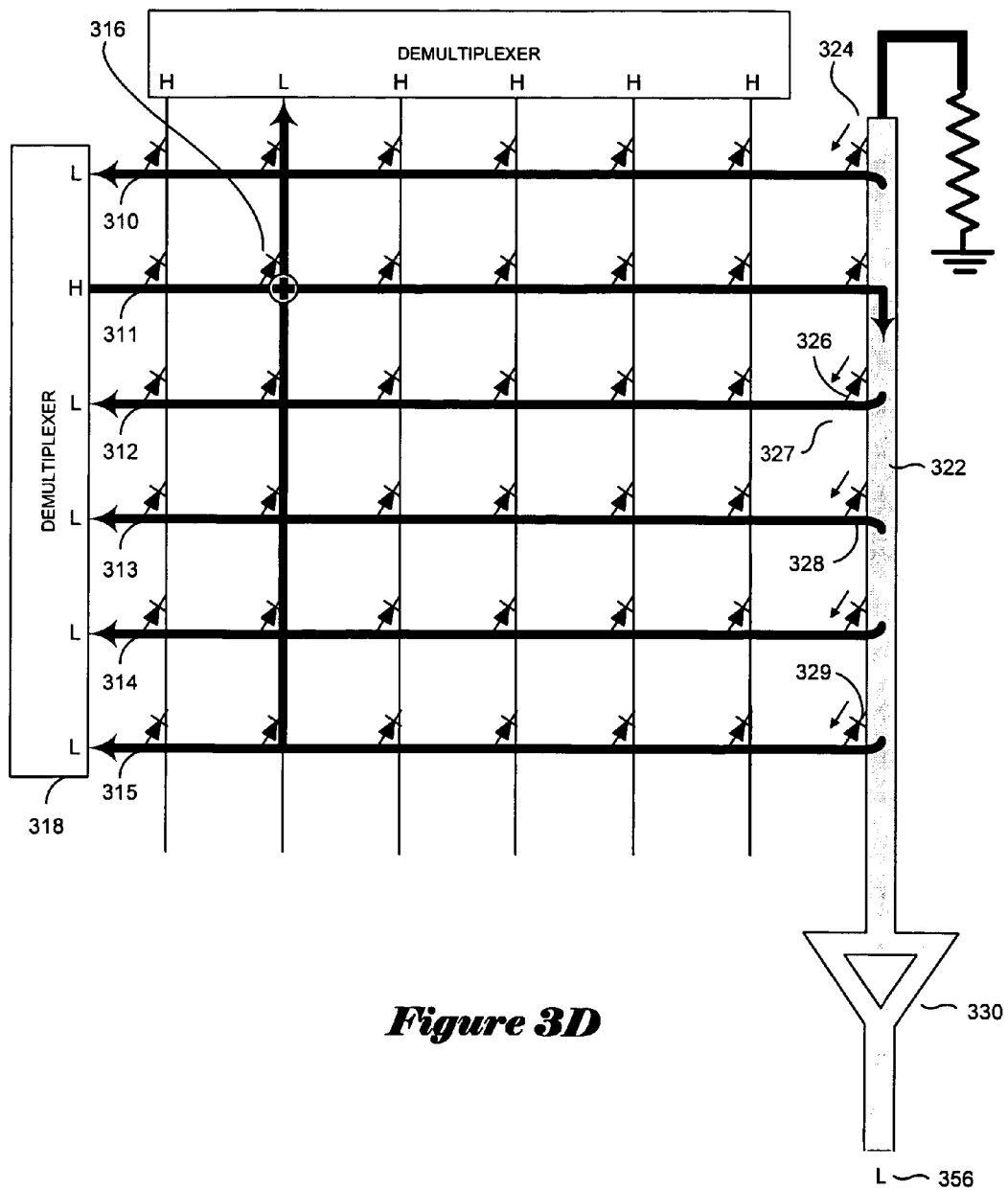

A second problem associated with the single-wire multiplexer implementation, discussed above, is that even if the diode-like nanowire junctions interconnecting the horizontal nanowires with the single-wire multiplexer can be fabricated, they must be fabricated within relatively close tolerances in order to ensure that undesirable circuits do not develop within the nanowire-crossbar memory. FIG. 3D illustrates undesirable circuits within a nanowire-crossbar memory, during a READ operation, when diode-like nanowire junctions interconnecting the nanowires with a single-wire multiplexer do not operate with specified directional signal-transmission characteristics. In FIG. 3D, single-bit storage element 316 is in an open state, resulting in transmission of a weak voltage or current signal, applied to nanowire 311 by the first multiplexer 318, all the way to the single-wire multiplexer 322. However, nanowire junctions 324 and 326-329, despite not being forward biased according to their specifications, nonetheless pass current in the reverse direction from the single-wire multiplexer 322 back to horizontal nanowires 310 and 312-315. Therefore, the signal applied to nanowire 311 by the first demultiplexer 318 returns via nanowires 310 and 312-315 to the first demultiplexer, rather than passing to the amplifier 330, resulting in output of a low signal 356 by the single-wire multiplexer, rather than the high signal that should be detected when single-bit storage element is in an open state, as discussed above with reference to FIG. 3B.

A third problem associated with the single-wire multiplexer implementation, discussed above, is that the electrical characteristics of the diode-like nanowire junctions interconnecting the horizontal nanowires with the single-wire multiplexer need to be carefully balanced with respect to the electrical characteristics of the single-wire multiplexer and other electronic components of the nanowire-crossbar memory. For example, the diode-like nanowire junctions interconnecting horizontal nanowires with the single-bit multiplexer need to be forward biased by signals applied to horizontal nanowires by the first demultiplexer, but should not be forward biased, or in a low resistance state, in the absence of applied signals. It may be difficult to match the characteristics of the diode-like nanowire junctions to those of the single-wire multiplexer.

Figure 4A:
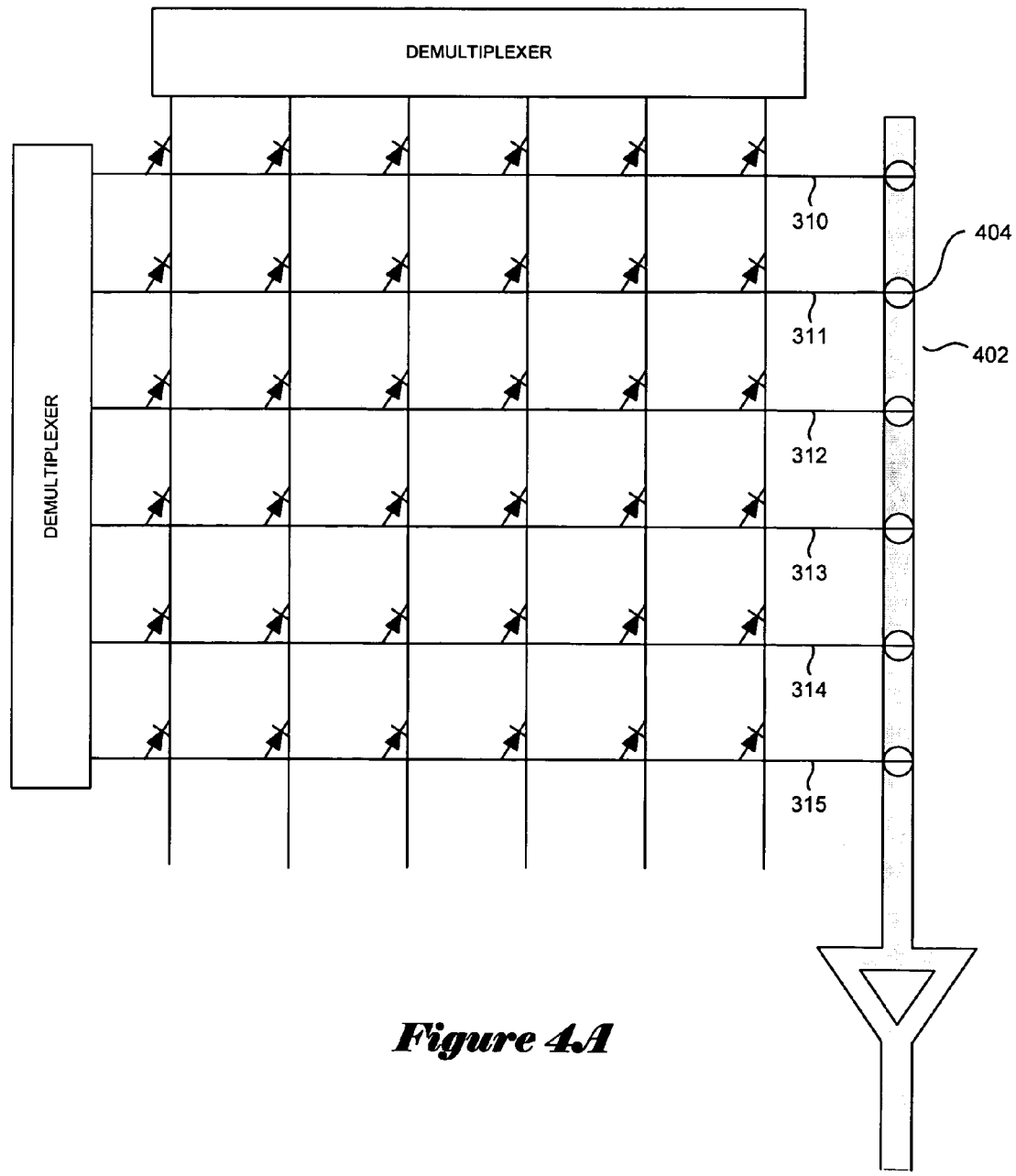
FIGS. 4A-E illustrate a single-wire multiplexer implementation suitable for facilitating READ operations directed to selected single-bit storage elements within a nanowire-crossbar memory, representing one embodiment of the present invention.

FIGS. 4A-E illustrate a single-wire multiplexer implementation suitable for facilitating READ operations directed to selected single-bit storage elements within a nanowire-crossbar memory, representing one embodiment of the present invention. FIGS. 4A-E use illustration conventions similar to those used in FIGS. 3A-D, which are not again described, in the interest of brevity. In the second single-wire-multiplexer implementation, that represents one embodiment of the present invention, horizontal nanowires 310-315 are not interconnected with the single-wire multiplexer 402 via diode-like nanowire junctions, as in the previously discussed implementation, above, but are instead interconnected through switch-like nanowire junctions. These switch-like nanowire junctions are shown in FIG. 4A by the unfilled circles, such as unfilled circle 404, at the intersections of horizontal nanowires 310-315 and the single-wire multiplexer 402.

The switch-like diode junctions are configurable. They can be opened by applying a first RESET signal through the horizontal nanowires and a second RESET signal through the single-wire multiplexer, and can be closed by applying a first SET signal to the horizontal nanowires and a second SET signal to the single-wire multiplexer. The signs and magnitudes of the RESET and SET signals may vary, depending on the particular chemical and physical characteristics of the switch-like nanowire junctions. For example, in certain cases, a first RESET signal may constitute a relatively large magnitude, positive voltage applied to a nanowire, and a second RESET signal may constitute a relatively large magnitude, negative voltage applied to the single-wire multiplexer 402. In this case, the opposite, first and second SET signals may have similar magnitudes, but opposite polarities.

Figure 4B:
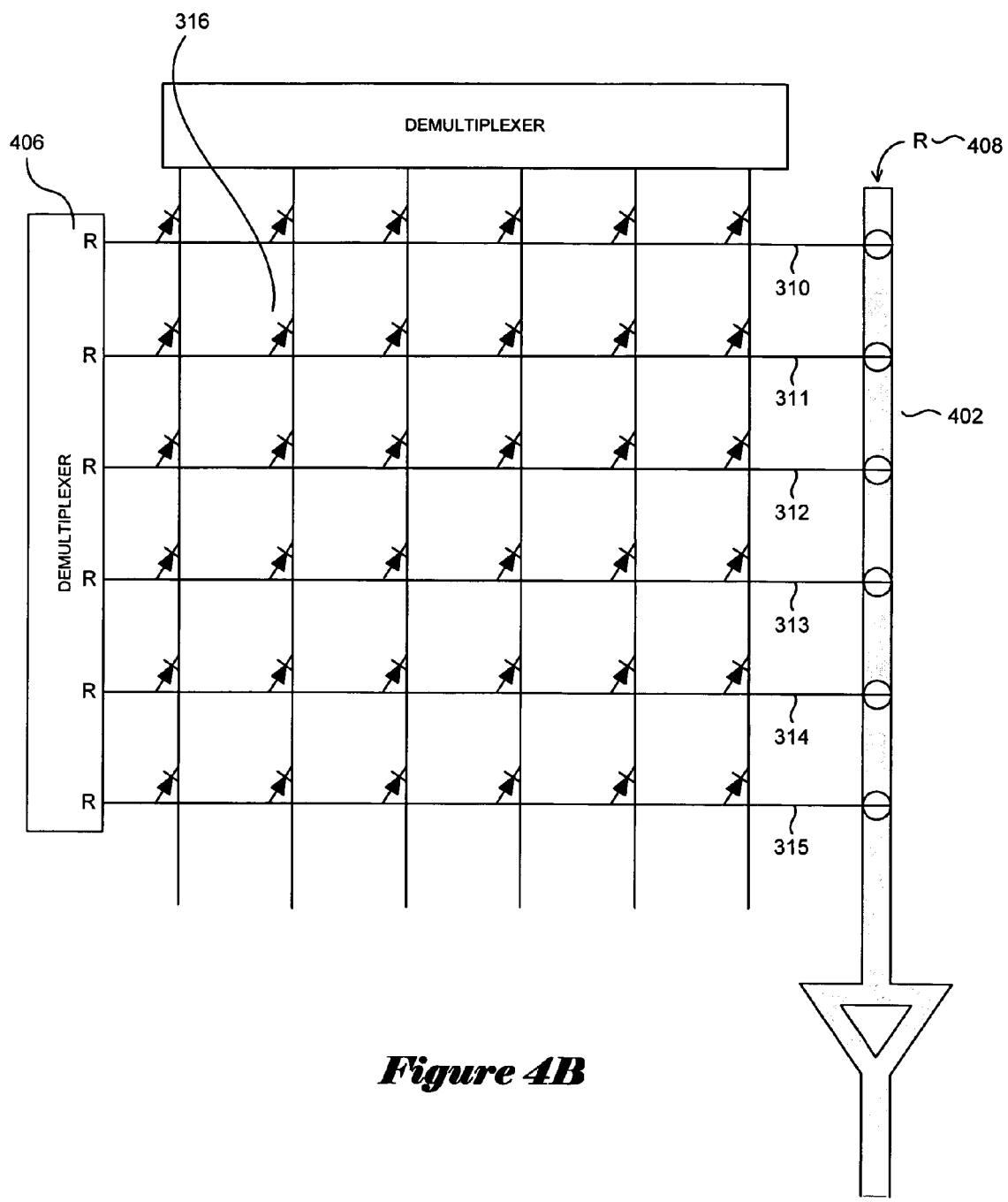
Figure 4C:
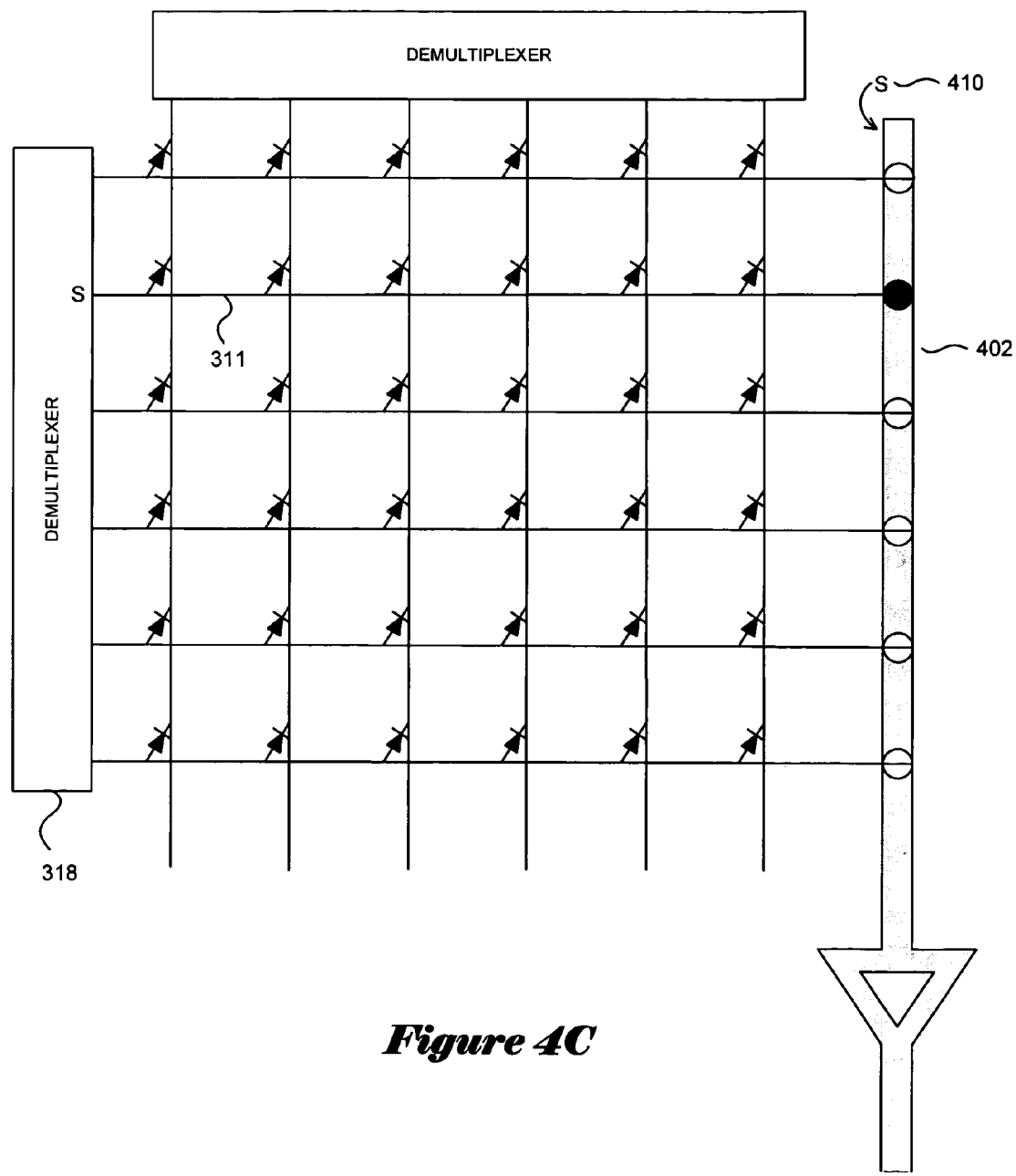
Figure 4D:
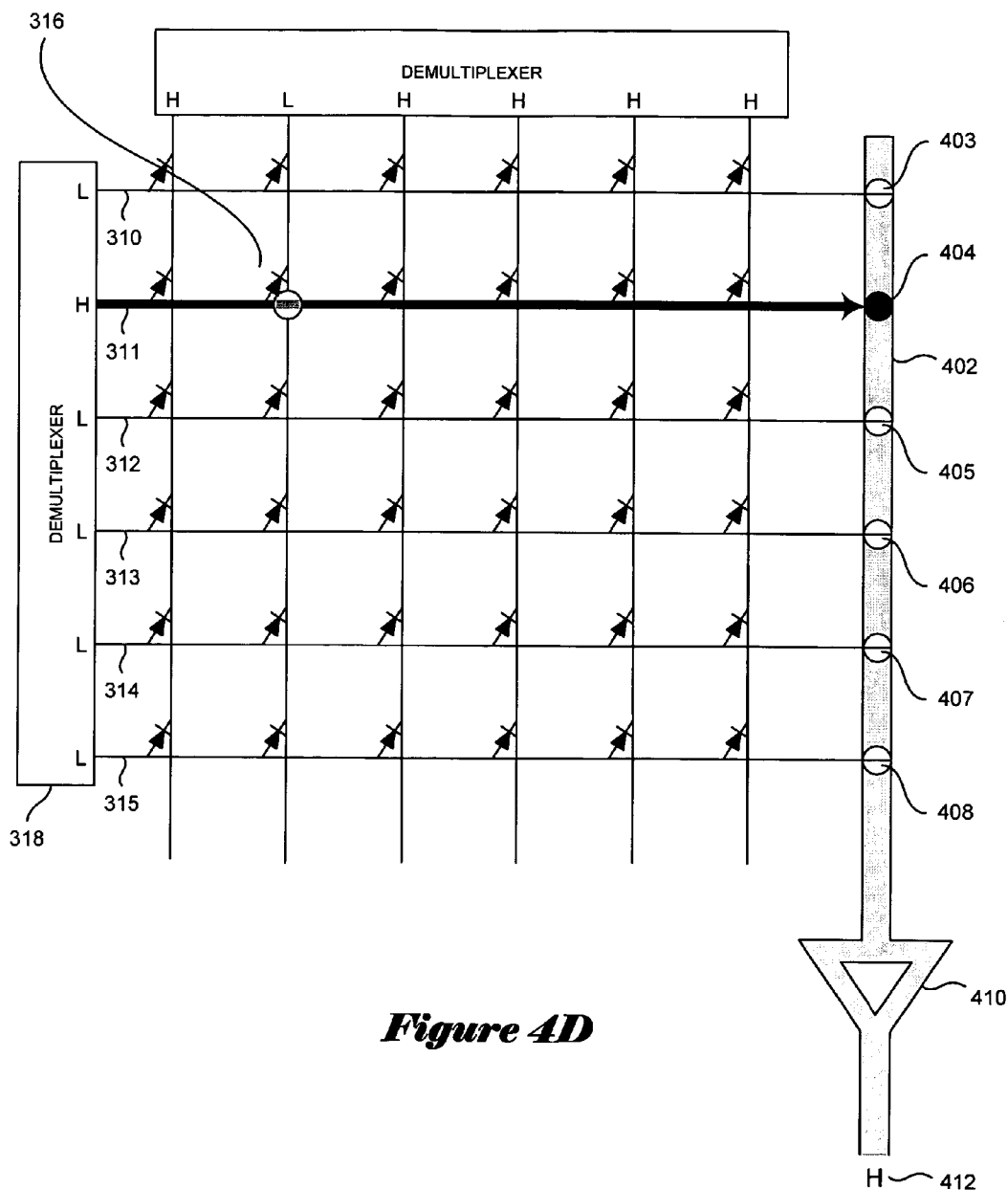
Figure 4E:
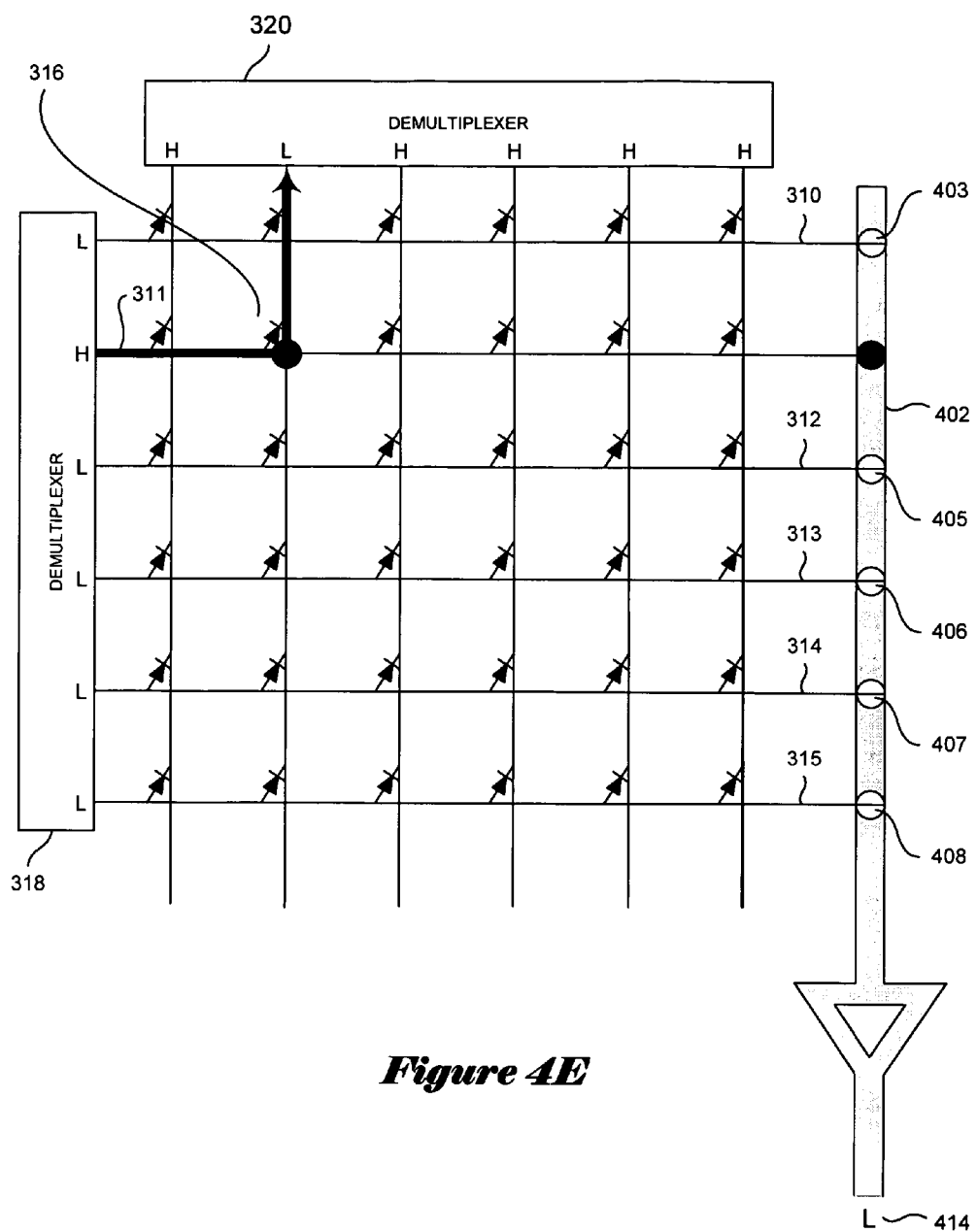

FIGS. 4B-E illustrate a three-cycle READ operation employed to read the contents of a selected single-bit storage element within the nanowire-crossbar memory. For the example discussed with reference to FIGS. 4B-E, the contents of single-bit storage element 316 are read. In a first step, shown in FIG. 4B, a first RESET signal, indicated by the symbols "R" (e.g. symbol 406) in FIG. 4B, is applied to all of the horizontal nanowires 310-315, and a second RESET signal 408 is applied to the single-wire multiplexer 402. Next, in a second step shown in FIG. 4C, a first SET signal is applied by the first demultiplexer 318 to horizontal nanowire 311 and a second SET signal 410 is applied to the single-wire multiplexer 402. Then, as shown in FIGS. 4D-E, the pattern of low and weak voltage or current signals supplied by the first and second demultiplexers to the nanowires, previously discussed with reference to FIGS. 3A-C, is again applied to read the contents of single-bit storage element 316. When single-bit storage element 316 is in an open state, as shown in FIG. 4D, then the weak voltage or current signal applied to nanowire 311 by the first demultiplexer 318 passes to the single-wire multiplexer 402 through the closed switch-like diode 404. The signal is amplified by the amplifier 410 interconnected with the single-wire multiplexer 404 to output a high signal 412. The remaining switch-like nanowire junctions 403 and 405-408 are open, and no current can pass in either direction between the remaining horizontal nanowires 310 and 312-315 and the single-wire multiplexer 402. Thus, the problems associated with diode-like nanowire junctions between nanowires and the single-wire multiplexer, discussed above, are avoided. Conversely, as shown in FIG. 4E, when the single-bit storage element 316 is in a closed state, a weak voltage or current signal applied to horizontal nanowire 311 by the first demultiplexer 318 passes through the nanowire junction 316, now in a low resistivity state, to the second demultiplexer 320, rather than to the single-wire multiplexer, resulting in a low signal 414 output by the single-wire multiplexer. The switch-like diodes interconnecting the remaining horizontal nanowires 310 and 312-315 to the single-wire multiplexer 402 are open, preventing any unintended backflow of current through horizontal nanowires 310 and 312-315 to the first demultiplexer 318.

Although the present invention has been described in terms of particular embodiments, it is not intended that the invention be limited to these embodiments. Modifications within the spirit of the invention will be apparent to those skilled in the art. For example, any of many different techniques and materials for fabricating switch-like nanowire junctions to interconnect nanowires of one plane of parallel nanowires in a nanowire crossbar to a single-wire multiplexer. As another example, a single-wire multiplexer may be used to extract information from any number of nanowire-crossbar-implemented devices, including memories. Depending on the implementation of the switch-like nanowire junctions, a different READ cycle sequence may be used in alternative embodiments. In yet additional embodiments, the multiplexer wire may also be a nanowire, interconnected with other nanoscale, sub-microscale, or microscale components.

The foregoing description, for purposes of explanation, used specific nomenclature to provide a thorough understanding of the invention. However, it will be apparent to one skilled in the art that the specific details are not required in order to practice the invention. The foregoing descriptions of specific embodiments of the present invention are presented for purpose of illustration and description. They are not intended to be exhaustive or to limit the invention to the precise forms disclosed. Obviously many modifications and variations are possible in view of the above teachings. The embodiments are shown and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents:

The invention claimed is:

1. A multiplexer interface for a nanowire crossbar, the multiplexer interface comprising:
   a single-wire multiplexer;
   a nanowire-crossbar with at least two sets of parallel nanowires interconnected by nanowire junctions; and
   switch-like nanowire junctions that each interconnect one nanowire from one set of the at least two sets of parallel nanowires of the nanowire-crossbar with the single-wire multiplexer.

2. The multiplexer interface of claim 1 wherein the single-wire multiplexer is connected to an amplifier which produces an output signal.

3. The multiplexer interface of claim 1 wherein each switch-like nanowire junction can be placed into an open state by applying a first RESET signal to a nanowire of the nanowire crossbar that intersects with the single-wire multiplexer at the nanowire junction and simultaneously applying a second RESET signal to the single-wire multiplexer.

4. The multiplexer interface of claim 1 wherein each switch-like nanowire junction can be placed into a closed state by applying a first SET signal to a nanowire of the nanowire crossbar that intersects with the single-wire multiplexer at the nanowire junction and simultaneously applying a second SET signal to the single-wire multiplexer.

5. The multiplexer interface of claim 1 wherein a current state of a selected nanowire junction within the nanowire crossbar can be determined by:
   applying a first RESET signal to each of the nanowires interconnected with the single-wire multiplexer through nanowire junctions, and applying a second RESET signal to the single-wire multiplexer;
   applying a first SET signal to the nanowire interconnected both with the single-wire multiplexer and the selected nanowire junction, and applying a second SET signal to the single-wire multiplexer; and
   applying a weak signal to the nanowire interconnected both with the single-wire multiplexer and the selected nanowire junction, holding any remaining nanowires of the nanowire crossbar interconnected with the single-wire multiplexer in a low state, holding any other nanowire interconnected with the selected nanowire junction, but not interconnected with the single-wire multiplexer, in a low state, holding any other nanowire interconnected with the selected nanowire junction, but not interconnected with the single-wire multiplexer, in a low state, and applying a weak signal to the remaining nanowires.

6. The multiplexer interface of claim 5 wherein voltage signals are applied to nanowires and the single-wire multiplexer to determine the current state of the selected nanowire junction.

7. The multiplexer interface of claim 5 wherein current signals are applied to nanowires and the single-wire multiplexer to determine the current state of the selected nanowire junction.

8. The multiplexer interface of claim 1 wherein the nanowire junctions that interconnect the nanowires within the nanowire crossbar are diode-like nanowire junctions.

9. The multiplexer interface of claim 1 wherein the nanowire crossbar is a memory, with information stored in physical states of the nanowire junctions that interconnect the nanowires within the nanowire crossbar.

10. The multiplexer interface of claim 1 wherein the single-wire multiplexer is a sub-microscale or larger signal wire.

11. A method for determining a current state of a selected nanowire junction interconnecting two nanowires within a nanowire crossbar having at least two sets of parallel nanowires interconnected through nanowire junctions, the method comprising:
    providing interconnection of one set of parallel nanowires of the nanowire crossbar to a single-wire multiplexer through switch-like nanowire junctions; and
    applying signals to the one set of parallel nanowires and the single-wire multiplexer in order to determine the current state of the selected nanowire junction by a signal output from the single-wire multiplexer.

12. The method of claim 11 wherein applying signals to the one set of parallel nanowires and the single-wire multiplexer further comprises:
    applying a first RESET signal to each of the nanowires of the nanowire crossbar interconnected with the single-wire multiplexer through switch-like nanowire junctions, and applying a second RESET signal to the single-wire multiplexer;
    applying a first SET signal to the nanowire interconnected both with the single-wire multiplexer and the selected nanowire junction, and applying a second SET signal to the single-wire multiplexer; and
    applying a weak signal to the nanowire interconnected both with the single-wire multiplexer and the selected nanowire junction, holding any remaining nanowires of the nanowire crossbar interconnected with the single-wire multiplexer in a low state, holding any other nanowire interconnected with the selected nanowire junction, but not interconnected with the single-wire multiplexer, in a low state, holding any other nanowire interconnected with the selected nanowire junction, but not interconnected with the single-wire multiplexer, in a low state, and applying a weak signal to the remaining nanowires of the nanowire crossbar.

13. The method of claim 11 wherein voltage signals are applied to nanowires and the single-wire multiplexer to determine the current state of the selected nanowire junction.

14. The method of claim 11 wherein current signals are applied to nanowires and the single-wire multiplexer to determine the current state of the selected nanowire junction.

15. The method of claim 11 wherein the nanowire junctions that interconnect the nanowires within the nanowire crossbar are diode-like nanowire junctions.

16. The method of claim 11 wherein the nanowire crossbar is a memory, with information stored in physical states of the nanowire junctions that interconnect the nanowires within the nanowire crossbar.

17. The method of claim 11 wherein the single-wire multiplexer is a sub-microscale or larger signal wire.

\* \* \* \* \*